United States Patent [19]

Obara et al.

[11] Patent Number: 4,836,636

[45] Date of Patent: Jun. 6, 1989

[54] OPTICAL SWITCH AND OPTICAL KEYBOARD UTILIZING THE SAME

[75] Inventors: Yuichi Obara; Kenichi Fuse; Yoshihiro Onuma, all of Hitatsuka; Takao Toya; Kazuo Chiba, both of Ichihara, all of Japan

[73] Assignee: The Furukawa Electric Co., Ltd., Tokyo, Japan

[21] Appl. No.: 118,065

[22] Filed: Nov. 9, 1987

[30] Foreign Application Priority Data

| Nov. 13, 1986 | [JP] | Japan | 61-173392 |
|---|---|---|---|
| Nov. 13, 1986 | [JP] | Japan | 61-173393 |
| Nov. 13, 1986 | [JP] | Japan | 61-173394 |
| Nov. 13, 1986 | [JP] | Japan | 61-268673 |
| Nov. 29, 1986 | [JP] | Japan | 61-284874 |
| Mar. 24, 1987 | [JP] | Japan | 62-43022 |
| Apr. 14, 1987 | [JP] | Japan | 62-56599 |
| Oct. 3, 1987 | [JP] | Japan | 62-250072 |
| Oct. 3, 1987 | [JP] | Japan | 62-250073 |

[51] Int. Cl.⁴ .............. G02B 6/36; H01J 5/16; B41J 5/08

[52] U.S. Cl. .............. 350/96.20; 350/96.10; 350/96.21; 250/227; 341/31; 400/477

[58] Field of Search .............. 350/96.10, 96.15, 96.16, 350/96.20, 96.21, 96.22; 250/227; 341/22, 26, 31; 400/472, 477, 478, 479.2, 481

[56] References Cited

U.S. PATENT DOCUMENTS

| 3,519,116 | 7/1970 | Koehn | 350/96.10 X |
|---|---|---|---|
| 3,668,407 | 6/1972 | Matzen et al. | 400/477 |
| 3,750,150 | 7/1973 | Cramer et al. | 400/477 |
| 3,856,127 | 12/1974 | Halfon et al. | 350/96.20 |
| 4,013,342 | 3/1977 | Narodny | 350/96.20 X |
| 4,023,887 | 5/1977 | Speers | 350/96.20 |
| 4,170,731 | 10/1979 | Howell et al. | 350/96.20 |
| 4,247,211 | 1/1981 | Behrendt et al. | 400/477 |
| 4,327,964 | 5/1982 | Haesly et al. | 350/96.20 |
| 4,376,566 | 3/1983 | Blackington | 350/96.20 |
| 4,417,824 | 11/1983 | Paterson et al. | 400/477 |
| 4,437,728 | 3/1984 | Ohashi | 350/96.20 |
| 4,442,425 | 4/1984 | Eibner | 341/31 X |
| 4,480,184 | 10/1984 | Ely | 250/227 |
| 4,534,668 | 8/1985 | Hildel et al. | 400/477 |
| 4,591,712 | 5/1986 | Thalmann | 250/227 |
| 4,741,590 | 5/1988 | Caron | 350/96.21 |
| 4,774,407 | 9/1988 | Erbe | 250/227 |

FOREIGN PATENT DOCUMENTS 61-14014  5/1986  Japan .............. 350/96.21

OTHER PUBLICATIONS

Cefarelli et al., "Three-Fiber System for Optical Interconnections", IBM Tech. Discl. Bull., vol. 20, No. 9, 2/78, pp. 3571–3572.

Uberbacher, "Optical Keyboard", IBM Tech. Discl. Bull., vol. 17, No. 3, 8/74, pp. 822–823.

Lawrence, "Mounting clip", IBM Tech. Discl. Bull, 11/83, vol. 26, No. 6, pp. 2899–2900.

Balliet et al., "Optical Fiber End Separation Spacer...", IBM Tech. Discl. Bull., vol. 4B, 9/84, pp. 2427–2428.

Primary Examiner—William L. Sikes
Assistant Examiner—Brian M. Healy
Attorney, Agent, or Firm—Foley & Lardner, Schwartz, Jeffery, Schwaab, Mack, Blumenthal & Evans

[57] ABSTRACT

An optical switch having a pair of optical fibers which has a stopper projected on the inner surface of a housing, the paired large diameter optical fibers being formed at the ends thereof, inserted into the housing and contacted with the ends thereof opposed on the same axis with both ends of the stopper at a predetermined interval between relative end faces thereof, and a light shielding plate disposed telescopically in or out between the end faces of the optical fibers in the housing for conducting or interrupting an optical path over both the optical fibers, and an optical keyboard utilizing the optical switch.

8 Claims, 6 Drawing Sheets

OPTICAL SWITCH AND OPTICAL KEYBOARD UTILIZING THE SAME

BACKGROUND OF THE INVENTION

This invention relates to an optical switch for conducting and interrupting an optical path and an optical keyboard which utilizes the optical switch.

A measuring controller, a machine controller, and a monitor controller, etc. have mostly employed in general as signal control means an electric system signal device.

Such electric system signal devices have been feasibly affected by electromagnetic induction near a power plant, a substation or a power transmission line, as has been pointed out, and a spark generated from an electric contact sometimes causes a fire in environments where combustible gas exists.

To eliminate such defects, means for remotely controlling these devices have been provided, but in the case of remote control, the properness and the rapidness of the signal control are defective.

Further, in the case of the electric system signal devices, corrosion resistance is also defective due to the generation of static electricity at the signal input unit and the electric contacts made of metal conductors.

To obviate such drawbacks it is desirable to construct a predetermined optical signal control system mainly with optical switches, and the optical signal control system can almost solve the above-mentioned drawbacks.

The general example of the optical switch applied to the optical signal control signal disclosed in Japanese Utility Model Publication No. 14014/1986 conducts and interrupts an optical path by attaching rod lenses to the ends of a pair of optical fibers for forming the optical path so that the ends are opposed in a housing and a light shielding plate is telescoped in or out between the rod lenses.

In the known example, since expensive components, such as the rod lenses have been employed, the optical switches become expensive.

In order only to reduce the cost, an optical switch of the structure that the end faces of the optical fibers are directly opposed without the rod lenses can be considered.

For example, optical fibers having large diameter cores are selectively used, and the coupling loss of the optical fibers in a light passing state can be reduced by decreasing the interval between the end faces of the optical fibers.

However, if the interval between the end faces of the optical fibers is reduced, as light shielding plate telescope in or out of the interval must be reduced in thickness. Thus, if the interval between the end faces of the optical fibers and the light shielding plate are not accurately formed correspondingly, the end faces of the optical fibers are damaged due to the contact of the end faces of the optical fibers and the light shielding plate to cause a foreign material to be bonded thereto so that the manufacture of the optical fiber become difficult.

Particularly, the damage and the adherence of a foreign material to the end faces of the optical fibers have become large problems in plastic optical fibers.

When the interval between the end faces of the optical fibers is reduced and the thickness of the light shielding plate is reduced in order to reduce the coupling loss between the optical fibers or to simplify the optical switch, an optical signal is passed through the thin light shielding plate with the result that the interruption of the optical path become incomplete.

In other devices, the optical switch must be reduced as small as possible to be associated therein, and it is very important that the assembling structure is stable and the attachment to a keyboard is facilitated.

SUMMARY OF THE INVENTION

Accordingly, an object of this invention is to provided a novel and useful optical switch which can eliminate the above-mentioned drawbacks and in which an optical keyboard utilizes the optical switches.

In order to achieve the above and other objects, there is provided according to the present invention an optical switch having a pair of optical fibers comprising a stopper projected on the inner surface of a housing in the housing, the paired optical fibers being formed at the end thereof in a large diameter, inserted into the housing and contacted at the end thereof opposed on the same axis with both ends of the stopper to hold a predetermined interval between relative end faces thereof, and a light shielding plate disposed telescopically in or out between the end faces of the optical fibers in the housing for conducting or interrupting an optical path over both the optical fibers.

According to another aspect of this invention, there is also provided an optical keyboard in an optical switch having a pair of optical fibers comprising a stopper projected on the inner surface of a housing in the housing, the paired optical fibers being formed at the end thereof in a large diameter, inserted into the housing and contacted at the ends thereof opposed on the same axis with both ends of the stopper to hold a predetermined interval between relative end faces thereof, and a light shielding plate disposed telescopically in or out between the end faces of the optical fibers in the housing for conducting or interrupting an optical path over both the optical fibers characterized by that both the optical fibers held at a predetermined interval between the relative ends thereof and the light shielding plate for conducting and interrupting the optical path over both the optical fibers are displaced to one side in the housing, the plurality of said optical switches are attached to a switch mounting board to form an optical switch row, and the optical fiber leads of the optical switches of the optical switch row are aligned substantially on the same line.

The above and other related objects and features of the invention will be apparent from a reading of the following description of the disclosure found in the accompanying drawings and the novelty thereof pointed out in the appended claims.

DESCRIPTION OF THE PREFERRED EMBODIMENTS

Embodiments of an optical switch and an optical keyboard utilizing the optical switch according to the present invention will be described in detail with reference to the accompanying drawings.

The optical switch of this invention will be first described.

An optical switch 24 as shown in FIGS. 1 to 5 comprises a plastic housing body 11, a bottom plate 12 of the housing, an elevationally movable operation shaft 13 driven under the guidance of the inner surface of the housing body 1, and a compression spring 14 interposed between the operation shaft 13 and the bottom plate 12.

Reference numerals 15A and 15B designate a pair of optical fibers, and numerals 16A and 16B denote sleeve fixedly secured to the outer peripheries of the ends of the optical fibers 15A and 15B, respectively.

Each of the sleeves 16A and 16B has an opening formed at the center. The optical fibers 15A and 15B are respectively inserted to the openings of the sleeves 16A and 16B to be bonded and integrated with the ends of the optical fibers 15A and 15B.

The optical fiber 15A and the sleeve 16A, and the optical fiber 15B and the sleeve 16B are respectively polished at the end faces in the integrated state so that the end faces become the same planes.

Sleeve guide openings 17A and 17B are horizontally formed in the housing body 11 to be disposed at the side of the operation shaft 13, and the sleeves 16A and 16B respectively integrated with the optical fibers 15A and 15B, and are respectively inserted into the guide openings 17A and 17B to be aligned on the same axis.

A stopper 18 projected upward from the inner surface of the housing is formed between the guide openings 17A and 17B on the inner surface of the housing body 11.

The stopper 18 projects in contact with the ends of the sleeves 16A and 16B and has a height that the ends of the optical fibers 15A and 15B do not contact because of the stopper 18.

Thus, the ends of the sleeves 16A and 16B inserted into the guide openings 17A and 17B contact both side surfaces of the stopper 18, so that the interval between the end faces of the optical fibers 15A and 15B is maintained constant.

The sleeves 16A and 16B are bonded fixedly to the housing body 11 in this state.

A light shielding piece 19 so integrally projects as to be introduced between the end faces of the optical fibers 15A and 15B.

Figure 5:
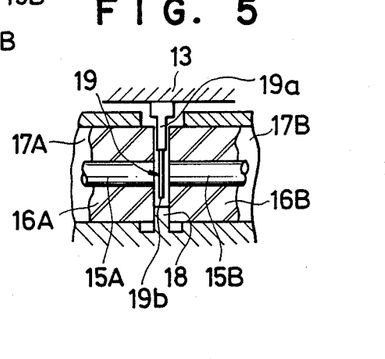
FIG. 5 is an enlarged horizontal sectional view showing the vicinity of a light shielding piece of the optical switch.

As shown in FIG. 5, the light shielding piece 19 has a thick portion 19a having a thickness to be inserted into the gap between the end faces of the sleeves 16A and 16B at the base end side of the light shielding piece 19, and a thin portion 19b reduced in thickness from both sides toward the end side.

It is noted that the alternative shape of such a light shielding piece 19 ha a tapered shape that the thickness is gradually reduced from the base end side toward the end side.

When the operation shaft 13 is moved upward or downward, the light shielding piece 19 is fed at the thin portion 19b through between the end faces of the optical fibers 15A and 15B, and is fed at the thick portion 19a through between the end faces of the sleeves 16A and 16B without passing between the end faces of the optical fibers 15A and 15B.

Figure 1:
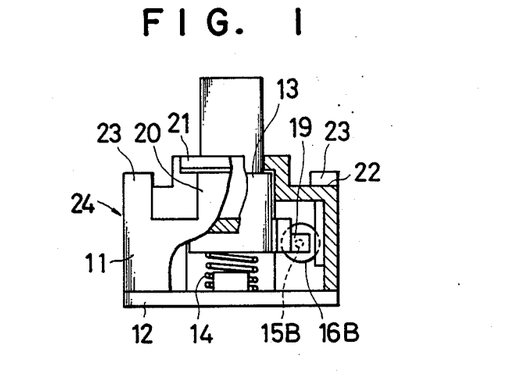
FIGS. 1, 2 and 3 are partly cutout front, side and plan views showing an embodiment of an optical switch according to the present inventions.

Therefore, as shown in FIG. 1, when the thin portion 19b of the light shielding plate 19 is disposed between the end face of the optical fibers 15A and 15B, an optical path is formed.

When the operation shaft 13 is pressed in this state, the light shielding plate 19 is moved down, and the thin portion 19b of the light shielding piece 19 is fed through between the end faces of the optical fibers 15A and 15B, thereby conducting the optical path.

The thick portion 19b of the light shielding piece 19 is formed upwardly longer than the thin portion 19b so that the thick portion 19a may not be fed out from between the end faces of the sleeves 16A and 16B even in this state described above.

When the operation shaft 13 is released, the operation shaft 13 is returned to the initial position by means of the recoiling force of the compression spring 14, and the light shielding piece 19 interrupts the optical path.

Thus, the optical path is conducted and interrupted.

The reason why the thick portion 19a and the thin portion 19b are formed on the light shielding piece 19 described above is because the light shielding piece 19 does not contact the end faces of the optical fibers 15A and 15B.

In a concrete example, the optical switch in which plastic optical fibers 15A and 15B having 0.5 mm of diameter were opposed at an interval of 0.38 mm at the end faces thereof, the thickness of the thick portion 19a of the light shielding piece 19 was 0.35 mm, and the thickness of the thin portion of the light shielding piece 19 was 0.26 mm, as determined by trial.

The optical switch 24 of this concrete example was confirmed that the coupling loss of the light passing state was 1.4 to 1.8 dB to be sufficiently useful.

Then, the assembly of the optical switch 24 described above will be described.

Figure 2:
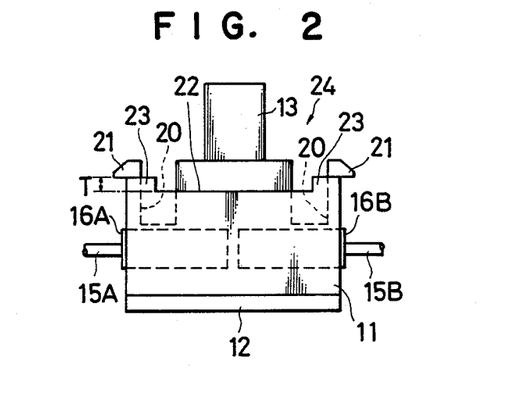
Figure 3:
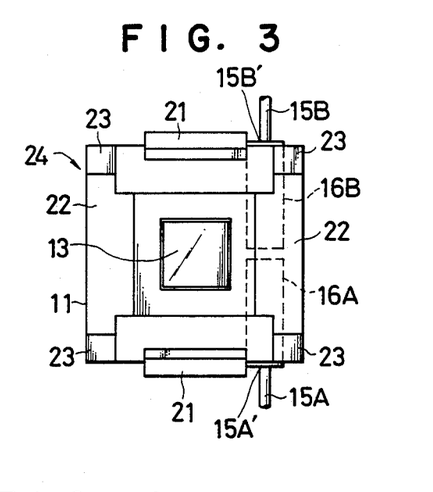
Figure 4:
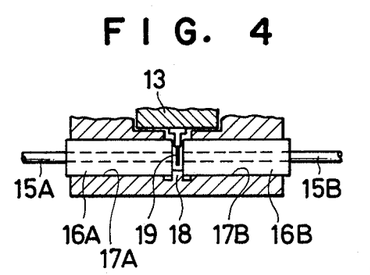
FIG. 4 is a horizontal sectional view showing the vicinity of a sleeve in the optical switch.

Elastic tongue pieces 20 each having an outward engaging pawl 21 are respectively formed at the upper left and right sides of the housing body 11, lower contacting surfaces 22, lower than the lower surfaces of the engaging pawls 21, are respectively formed at the upper front and rear sides of the housing, and positioning projections 23 are respectively formed at upper four corners of the housing body 11.

A stepwise difference T from the lower surface of the engaging pawl 21 to the contacting surface 22 corresponds to the thickness of a substrate 25, to be described later.

Figure 6:
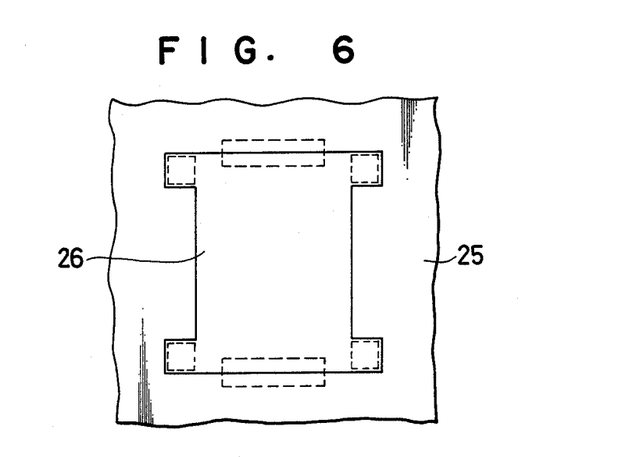
FIG. 6 is a plan view of a substrate on which the optical switch is mounted.
Figure 7:
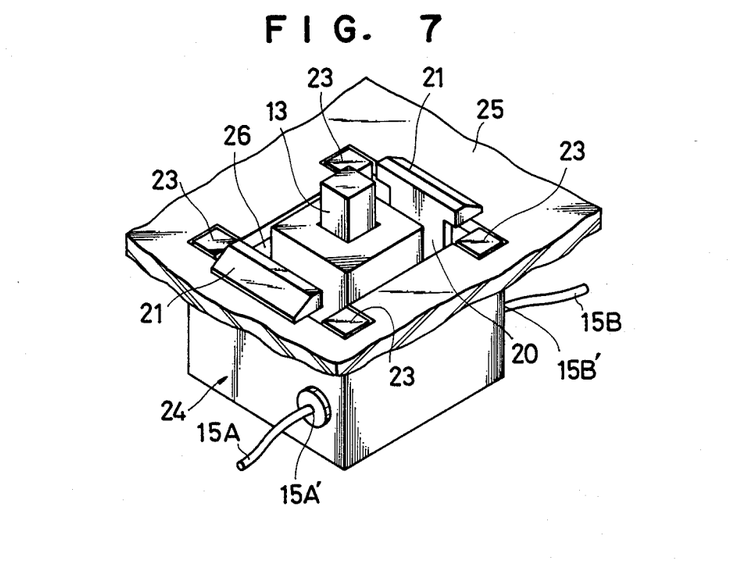
FIG. 7 is a perspective view of the state that the optical switch is mounted on the substrate.

As apparent with reference to FIGS. 6 and 7, an opening 26 is formed at a substrate 25 on which the optical switch 24 is mounted.

In FIG. 7, when the optical switch 24 having the optical fibers 15A and 15B is intruded from the lower side of the substrate 25 into the opening 26, the engaging pawl 21 initially sliding on the inner surface of the opening 25 is moved to the inside, the elastic tongue piece 20 is then deflected, and the contacting surface 22 is then contacted with the lower surface of the substrate 25. At this time, the engaging pawl 21 is relatively engaged with the upper edge of the opening 25 by the recoiling strength of the elastic tongue piece 20.

Thus, the substrate 25 is held between the lower surface of the engaging pawl 21 and the contacting surface 22, and the optical switch 24 is fixed to the substrate 25 without displacing.

Then, other embodiments of an optical switch 24 according to this invention will be described.

In the embodiment described above, the optical switch 14 in which the optical path conduct when the operation shaft 13 is pressed and is interrupted when the operation shaft 13 is released, is provided. However, the optical switch 24 may also be turned ON and OFF by the reverse operations to the above, and the conducting and interrupting states may also be held within the scope of this invention by slightly modifying in design or an additional structure.

The light shielding piece 19 may also have a predetermined thickness without the thick portion 19a and the thin portion 19b.

At least the thin portion 19b of the light shielding piece 19 is made of an opague material having a light shielding function as known per se, and when the thin portion 19b is particularly thinly formed, a light absorbing material may be contained in a part (in the thin portion 19b) or the entirety of the light shielding plate 19 so at to reliably shield the light at light shielding time, i.e., to prevent the light from passing therethrough.

For example, when the light shielding piece 19 is formed of plastic, such as ABS, or polycarbonate, the plastic light shielding piece 19 contains, for example, light absorbing material made of carbon.

In a concrete example, when the thickness of the thin portion 19b of the plastic light shielding piece 19 is 0.3 mm and the carbon content rate of the light shielding piece 19 was approx. 0.5%, the light permeability attenuation rate at light interrupting time of the light shielding piece 19 was approx. 25 to 30 dB, but when the carbon content rate was 2% or higher, the light permeability attenuation rate was increased by 10% or more.

The carbon content rate of the light shielding piece 19 is desirably set to a range so as not to lose moldability.

Other members except the optical fibers 15A and 15B such as the housing body 11, the bottom plate 12 and the operation shaft 13 are molded of plastic which contains the light absorbing material as required.

In a concrete example, when the housing body 11 and the bottom plate 11 were molded of the plastic which has approximately 0.5 to 1% of carbon content rate, the operation shaft 13 including the light shielding piece 19, it is desirable to mold the operation shaft 13 including the light shielding piece 19 of plastic which is approx. 3 times as large as the above-mentioned content.

When the light shielding piece 19 and the other members are molded of the plastics which have equal light absorbing material content rates, the light absorbing material content rate of this case is desirably 2% or more by weight.

When the ends of the optical fibers 15A and 15B can be increased, the members except the sleeves may be attached to the ends of the optical fibers.

Figure 8:
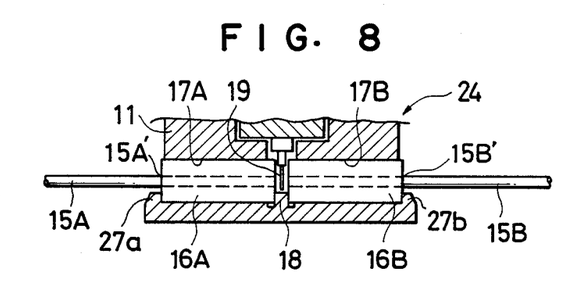
FIGS. 8 and 9 are sectional views showing the essential portions of various examples of means for fixing the sleeve in the housing of the optical switch.
Figure 9:
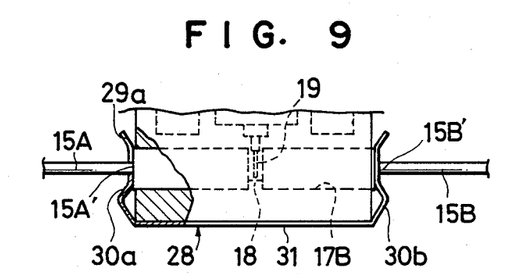
Figure 10:
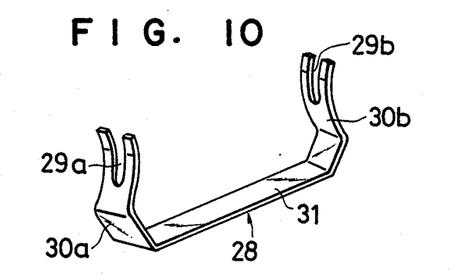
FIG. 10 is a perspective view of a stopper used for the fixing means of FIG. 8.

As means for fixing the sleeves 16A and 16B in the guide openings 17A and 17B to the housing body 11, means shown in FIGS. 8, 9 and 10 may be arbitrarily employed instead of the bonding means described above or together with the bonding means.

In case of FIG. 8, elastically deformable pawl pieces 27a and 27b are integrally formed with the housing body 11 at the inlet ends of the guide openings 17A and 17B of the housing body 11.

In FIG. 8, the sleeves 16A and 16B inserted respectively into the guide openings 17A and 17B are, similarly as described above, held through the pawl pieces 27a and 27b in the inserted state, and the ends of the sleeves 16A and 16B are contacted with both the ends of the stopper 18 by the pressing strengths of the pawl pieces 27a and 27b so that the sleeves 16A and 16B are held at predetermined positions in the housing body 11.

In the case of FIG. 9, a channel type stopper 28 shown in FIG. 10 is employed.

Such a stopper 28 is formed of a metal or a plastic spring material, and is composed of retaining pieces 30a and 30b having slits 29a and 29b, and a coupling piece 31 for coupling the base ends of both the retaining pieces 30a and 30b.

In the stopper 28, the narrowest interval between the retaining pieces 30a and 30b is shorter than the width of the housing body 11.

In the case of FIG. 9, after the sleeves 16A and 16B are respectively inserted into the guide openings 17A and 17B, the stopper 28 is attached from the bottom side of the housing body 11 over both sides, and the retaining piecs 30a and 30b of the stopper 28 are pressed at the rear end faces of the sleeves 16A and 16B toward the stopper 18.

Thus, the end faces of the sleeves 16A and 16B are contacted with both side faces of the stopper 18 through the pressing strengths of the retaining pieces 30a and 30b, and the sleeves 16A and 16B are held at predetermined positions in the housing body 11.

In this case, the optical fibers 15A and 15B are engaged within the slits 29a and 29b of the retaining pieces 30a and 30b.

The stopper 28 described above may also be attached from the front sides of the housing body 11 over both sides thereof, and the directions and the shapes of the retaining pieces 30a and 30b and the directions of the slits 29a and 29b may be suitably selectively determined in response to the attaching direction, and the slits 29a and 29b may be omitted as required.

Figure 11:
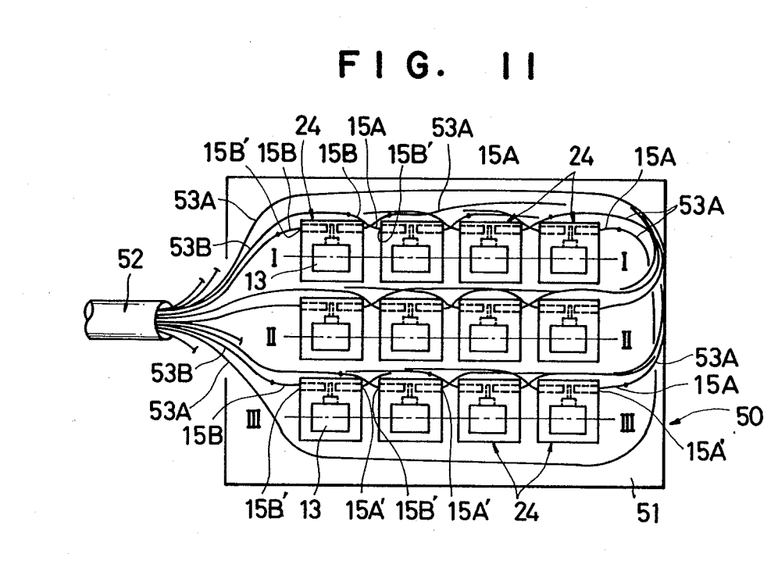
FIG. 11 is a plan view schematically showing one embodiment of an optical keyboard utilizing the optical switch according to the present invention.

In FIG. 11, an optical keyboard 50 comprises a switch mounting board 51, and a number of optical switches 24 mounted on the switch mounting board 51.

In the case of the optical switches 24 as described above, the optical fibers 15A and 15B and the light shielding piece 19 are displaced to one side in the housing 11.

In the optical keyboard 50, the optical switches 24 are mounted, for example, on the switch mounting board 51 similarly to the mounting procedure to the above-mentioned substrate 25, predetermined number of optical switches 24 are arranged in I, II and III rows.

The optical switches 24 of the I, II and III rows mounted on the switch mounting board 51 are aligned substantially on one line of the leads 15A and 15B of the optical fibers 15A and 15B at both sides of the housing 11.

Thus, optical fibers 53A and 53B led from an optical cable 52 are respectively connected to the optical fibers 15A and 15B of the optical switch 24 mounted on the switch mounting board 51.

Since the optical fiber leads 15A' and 15B' are aligned on one line in the optical keyboard 50 of FIG. 11, the optical fibers can be readily wired and corrected so that unreasonable bents are not formed at the optical fibers 15A and 15B.

Figure 12:
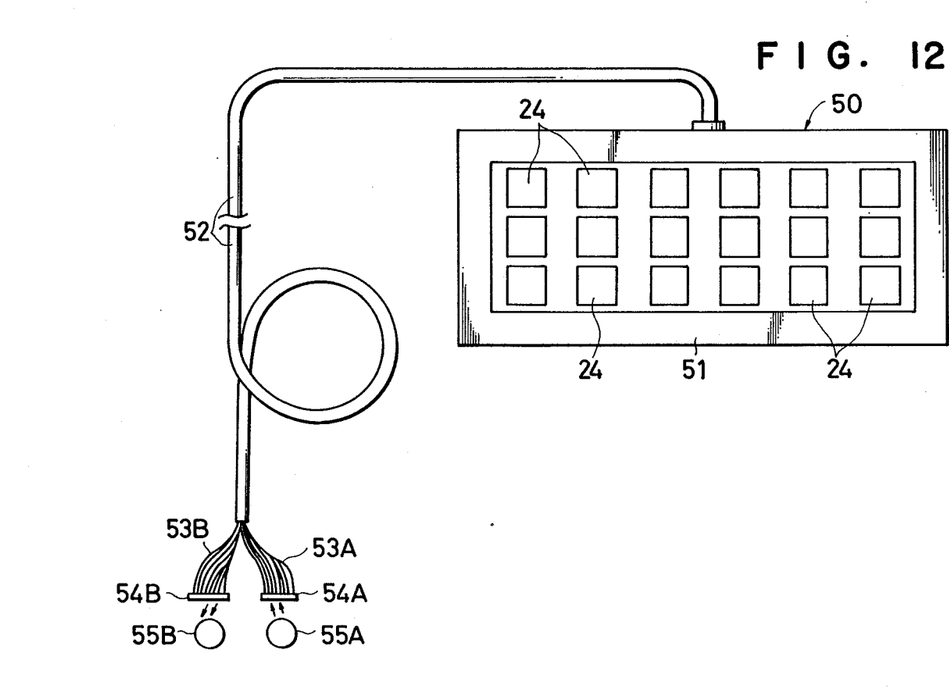
FIG. 12 is an explanatory view schematically showing the example of using the optical keyboard.

FIG. 12 shows a concrete example of the optical keyboard 50 using the optical switches.

In the case of FIG. 12, one end of the optical cable 52 is connected to the optical switches 24 of the optical keyboard 51 as described above, optical fiber arrays 54A and 54B are connected respectively to the optical fibers 53A and 53B at the other end side of the optical cable 52, and light emitting element array 55A and photodetector array 55B are respectively connected to the optical fiber arrays 54A and 54B.

When the optical keyboard 50 constructed as described above is used in a combustible gas environment, the photodetector array 55B is preferably separated from te optical keyboard 50 due to explosion-proof remedy, and it is also true when the optical cable is distinguished between for light transmitting and receiving operations.

The optical switch of this invention is so constructed that the ends of the optical fibers are formed in a large diameter, the large-diameter ends of the optical fibers are contacted with both side stopers in the housing to hold the interval between the end faces of the optical fibers. Thus, the optical switches disposed at a constant interval between the end faces of the optical fibers can be simply assembled.

When the sleeves are mounted on the outer peripheries of the ends of the optical fibers and the ends of the optical fibers are formed in large diameters in the optical switch of this invention, the ends of the optical fibers can be readily increased in diameter. Further, when the end faces of the sleeves are contacted with the stopper, the intercal between the end faces of the optical fibers can be set to a predetermined value without damaging the end faces of the optical fibers.

When the housing has the optical shaft movable reciprocatingly in a direction perpendicular to the axes of both the optical fibers with the housing as a guide and the light shielding piece telescoped in or out between the end faces of the optical fibers corresponding to between the end faces of the optical fibers is mounted on the side of the operation shaft in this invention, a space necessary to guide the operation shaft and a space necessary to reciprocate the operation shaft may be provided in the axial direction of the operation shaft to reduce the axial size of the operation shaft.

When the light shielding piece has the thick portion at the base end side or the thin portion at the end side, or the light shielding piece has a tapered portion convergent from the base end to the end side in the optical switch of this invention, even if the interval between the end faces of the optical fibers is reduced in the directly opposed state, the light shielding plate is not contacted with the end faces of the optical fibers to eliminate the damage of the end faces of the optical fibers.

When the light shielding piece is made of plastic having light absorbing property in the optical switch of this invention, the light shielding property of the light shielding piece is improved, the thin light shielding piece may reliably interrupt the light, the light coupling loss can be reduced and the optical switch can be reduced in size by decreasing the interval between the end faces of the optical fibers in response to the thin light shielding piece.

When the elastic tongue pieces having outward engaging pawls at the upper ends thereof are formed at the upper right and left sides of the contacting surfaces lower than the lower surfaces of the engaging pawls are formed at the upper front and rear sides of the housing in the optical switch of this invention, the optical switch can be mounted by a simple operation of merely pressing the top of the optical switch to the opening of the substrate, and when positioning projections are formed at upper four corners of the housing in this state in the optical switch of this invention, the optical switch can be mounted more firmly.

Since the optical keyboard of this invention is so constructed that, in the relative configuration of the optical switch and the switch mounting board described above, both the optical fibers and the light shielding plate are displaced to one side in the housing, the plurality of said optical switches are attached to a switch mounting board to form an optical switch row, and the optical fiber leads of the optical switches of the optical switch row are aligned substantially on the same line, the optical fibers can be readily wired and connected, and, in this case, unreasonable bends are not formed in the optical fibers, and suitable signal control can be safely, rapidly and simply performed at electromagnetic induction generating positions or under combustible gas environments.

What is claimed is:

1. An optical switch, comprising:
   a pair of large diameter optical fibers;
   a housing having an opening at each end thereof;
   sleeves into which the ends of the fibers are inserted, each sleeve being fitted into one opening of the housing, the sleeves so fitted being positioned on the same longitudinal axis;
   a stopper on the inner surface of the housing, the stopper projecting inwardly to form an abutment for each sleeve and thereby provide a predetermined space between each sleeve and fiber end face: and
   a light shielding plate moveable into or out of the space between the end faces of the optical fibers in the sleeves for selectively interrupting or permitting optical continuity between the fibers in each sleeve.

2. The optical switch according to claim 1, further including a shaft movable perpendicularly to the longitudinal axis of the sleeves, the light shielding plate being selectively moved by said shaft in or out between the end faces of the optical fibers to selectively open or close the optical switch.

3. The optical switch according to claim 1, wherein said light shielding plate includes a thin portion at the end thereof to be inserted between the fiber end faces.

4. The optical switch according to claim 1, wherein said light shielding plate tapers toward the end insertable between the optical fiber ends.

5. The optical switch according to claim 1, wheren said light shielding plate is made of a light absorbing plastic.

6. The optical switch according to claim 1, wherein elastic tongue pieces having outward engaging pawls at the upper ends thereof are formed at the upper sides of the housing for engagement with contacting surfaces on the housing.

7. The optical switch according to claim 1, wherein positioning projections for the switch are formed on the housing therefor.

8. An optical keyboard formed of optical switches, each switch including a pair of large diameter optical fibers; sleeves into which the fibers are inserted; a housing in which the fiber-containing sleeves are retained, the sleeves being in longitudinal alignment with each other; a stopper on the inner surface of the housing, the stopper establishing a predetermined distance between the end faces formed at the end of each sleeve and the fiber therein; and a light shielding plate disposed telescopically between the end faces for effecting or interrupting an optical path between the optical fibers, both the optical fibers and the light shielding plate being displaced to one side in the housing, whereby the optical switches are attached to a switch mounting board to form an optical switch row, the fibers in each switch row being substantially longitudinally aligned.

* * * * *